United States Patent [19]

Fujiyama et al.

[11] Patent Number: 4,539,934
[45] Date of Patent: Sep. 10, 1985

[54] PLASMA VAPOR DEPOSITION FILM FORMING APPARATUS

[75] Inventors: Yasutomo Fujiyama; Shotaro Okabe, both of Kawasaki, Japan

[73] Assignee: Canon Kabushiki Kaisha, Tokyo, Japan

[21] Appl. No.: 647,607

[22] Filed: Sep. 6, 1984

[30] Foreign Application Priority Data

Sep. 14, 1983 [JP] Japan ................................ 58-168376

[51] Int. Cl.³ ............................................. C23C 13/08
[52] U.S. Cl. ................................... 118/723; 118/50.1; 118/719; 427/39
[58] Field of Search ...................... 118/50.1, 715, 719, 118/723, 730; 427/39, 74; 204/298; 430/128

[56] References Cited

U.S. PATENT DOCUMENTS 4,226,208 10/1980 Nishida et al. ................... 118/719 X
4,369,730 1/1983 Izu et al. ............................. 118/723
4,466,380 8/1984 Jansen et al. .................... 118/723 X
4,482,419 11/1984 Tsukada et al. ..................... 204/298

FOREIGN PATENT DOCUMENTS 3217708 12/1982 Fed. Rep. of Germany .
2114160 8/1983 United Kingdom .

Primary Examiner—John D. Smith
Assistant Examiner—Bernard F. Plantz
Attorney, Agent, or Firm—Fitzpatrick, Cella, Harper & Scinto

[57] ABSTRACT

In a vapor deposition film forming apparatus having a plurality of reactors each having a substrate and an electrode oppositely arranged in a vacuum chamber and means for applying a voltage thereacross to react or decompose reaction gas introduced into the vacuum chamber, the reactors are arranged on the circumference of a circle and exhaust pipes having substantially equal exhaust resistance radially extend to the reactors from a common exhaust pipe located at the center of the circle.

1 Claim, 4 Drawing Figures

PLASMA VAPOR DEPOSITION FILM FORMING APPARATUS

BACKGROUND OF THE INVENTION

1. Field of the Invention

The present invention relates to an improvement in a vapor deposition film forming apparatus, and more particularly to an improvement in an apparatus for forming a photo-conductive film, a semiconductor film, an inorganic insulative film or an organic resin film on a conductive substrate by a plasma CVD method.

2. Description of the Prior Art

In a prior art apparatus for forming an electrophotographic photo-conductive drum by depositing an amorphous silicon photo-conductive film on a cylindrical metal substrate surface such as an aluminum surface by a plasma CVD method, a cylindrical cathode electrode which is coaxial with the substrate is arranged so that a glow discharge occurs between the electrode and the substrate. An example of such an apparatus is shown in FIG. 1 in a longitudinal sectional view. Numeral 11 denotes a cylindrical cathode electrode which is coaxial with a cylindrical substrate (anode electrode) 12. Numeral 13 denotes a doughnut-shaped electrical insulator, numeral 14 denotes a vacuum chamber wall, numeral 15 denotes an RF power supply, numeral 16 denotes a reaction gas discharge pipe, numeral 17 denotes a vacuum exhaust pipe, numeral 18 denotes a substrate heater, numeral 19 denotes a substrate rotating mechanism and numeral 20 denotes ground.

In this apparatus, since one substrate is arranged in one reactor, distribution of thickness of the amorphous silicon film which is easily affected by a gas flow path can be readily adjusted, and an excellent film characteristic is obtained because of excellent discharge stability.

In mass-production by such an apparatus, it is necessary to increase the number of reactors. It is usually required for independent control of discharge parameter to provide a reaction gas supply system, a vacuum exhaust system and an RF power supply separately for each reactor. FIG. 2 shows a diagram of a multi-reactor apparatus in which four reactors are used. Numeral 1 denotes a reactor, numeral 2 denotes a matching circuit, numeral 3 denotes an RF power supply, numeral 4 denotes a coaxial cable, numeral 5 denotes a vacuum pump, numeral 6 denotes an exhaust pipe, numeral 7 denotes a reaction gas flow rate controller and numeral 8 denotes a reaction gas supply pipe.

As the number of reactors increases as shown in FIG. 2, associated facilities also increase proportionally and the parameters must be controlled for each reactor. Thus, in the prior art apparatus, it has been inevitable that the increase of the number of reactors increased the associated facilities and complicated the control operation.

SUMMARY OF THE INVENTION

It is an object of the present invention to provide a vapor deposition film forming apparatus having a plurality of reactors which does not require additional associated facilities and does not complicate the control operation as the number of reactors increases.

It is another object of the present invention to provide a vapor deposition film forming apparatus having a substantially equal vacuum exhaust resistance in each of reactors.

It is other object of the present invention to provide a vapor deposition film forming apparatus having a plurality of reactors for forming deposition films on substrates by arranging the substrates and opposing electrodes in vacuum chambers and applying voltages thereacross to react or decompose reaction gas introduced into the vacuum chambers, wherein center axes of the reactors are arranged on the circumference of a circle and exhaust pipes having an equal exhaust resistance radially extends from a common exhaust pipe located at the center of the circle to the respective reactors.

DETAILED DESCRIPTION OF THE PREFERRED EMBODIMENT

Figure 3:
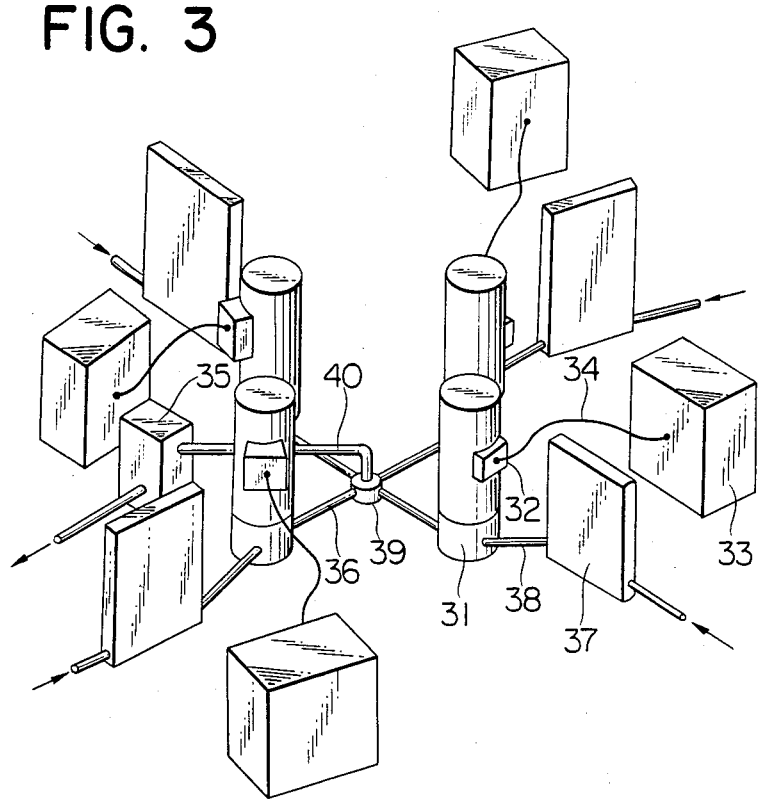
FIG. 3 is a diagram of an apparatus of the present invention.
Figure 4:
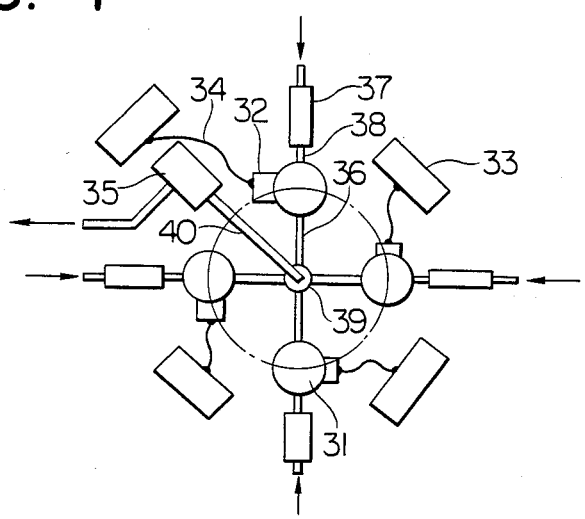
FIG. 4 is a plan view of the apparatus of FIG. 3.

An embodiment of the present invention is now explained with reference to FIGS. 3 and 4. FIGS. 3 and 4 show a diagram and a plan view of the preferred embodiment of the present invention. Four reactors are used in the present embodiment although that number is not restrictive. Reactors 31 are arranged on the circumference of a circle. Numeral 32 denotes a matching circuit for matching an impedance of glow discharge, numeral 33 denotes an RF power supply, numeral 34 denotes a coaxial cable connected from the RF power supply 33 to the matching circuits of the reactors, and numeral 35 denotes a vacuum pump for vacuuming the reactors.

Numeral 36 denotes an exhaust pipe connecting the reactor 31 and an exhaust pipe distributor 39 located at the center of the circle. The diameters and shapes of those exhaust pipes are selected such that the exhaust pipes have a substantially equal exhaust resistance. Preferably, the lengths, diameters and shapes of those exhaust pipes are selected to be identical. The exhaust pipe distributor 39 is connected to one set of vacuum pump 35 by a common exhaust pipe 40. Alternatively, the exhaust pipe distributor 39 may be omitted and the exhaust pipes 36 may be connected to the common exhaust pipe 40 with substantially equal exhaust resistance. The vacuum pump 35 may be one set so long as it has a sufficient capacity to vacuum four reactors 31. A plurality of vacuum pumps may be parallelly operated depending on the number of reactors and the capacity of the vacuum pumps.

An exhaust rate control valve may be provided in the common exhaust pipe 40 so that the vacuum in the reactors is maintained unchanged even if the number of reactors in operation changes.

Numeral 37 denotes a reaction gas flow rate controller and numeral 38 denotes a reaction gas supply pipe for supplying the reaction gas from the flow rate controller to the reactor.

The number of reactors may be increased by merely increasing the radius of the circle on which the reactors are arranged.

In order to form deposition films by the apparatus shown in FIGS. 3 and 4, deposition chambers in the reactors are vacuumed to $10^1$–$10^{-3}$ Torr, and reaction gas for forming the deposition films and necessary carrier gas or dopant gas for introducing impurities into the films to be formed are introduced at desired pressure and flow rate. For example, in order to form hydrogenated amorphous silicon (a-Si:H) films on substrates, $SiH_4$ gas, $Si_2H_6$ gas or a combination of those gases and an appropriate amount of $H_2$, He or Ar is introduced into the deposition chambers. The deposition chambers are vacuumed in accordance with the above process, the substrate temperature is set to 200°–400° C., a gas mixture consisting of 5–40% by volume of $SiH_4$ and 95–60% by volume of $H_2$ is introduced into the deposition chambers at a gas pressure of 0.1–2 Torr and at a gas flow rate of 0.1–2 l/min, RF power is applied to the cathode electrodes from the RF power supply through the matching circuit to excite glow discharges, and the reaction gas is decomposed to form the a-Si:H films on the substrates.

A source gas may be silane ($SiH_4$, $Si_2H_6$, $Si_3H_8$, $Si_4H_{10}$) as amorphous silicon film forming material, $H_2$ as base gas, rare gas, $SiF_4$ for introducing fluorine, $B_2H_6$, $PH_3$, $AsH_3$ for controlling a p or n conductivity, $N_2$, $NH_3$ for introducing nitrogen, $N_2O$, NO for introducing oxygen, hydrocarbon such as $CH_4$, $C_2H_4$ for introducing carbon or other gas known to contain atoms which can be introduced by the plasma CVD method. Those gases may be combined at predetermined proportions by a mass flow controller.

The present apparatus may be applied to form an insulative film such as $Si_3N_4$, SiC, $SiO_2$ or SiO. The present apparatus may also be applied to form an organic resin film.

An embodiment to form the a-Si:H film by the present apparatus is explained below.

The a-Si:H film was formed by the vapor deposition film forming apparatus shown in FIGS. 3 and 4 by using gas mixture of $SiH_4$ gas and $H_2$ gas as the reaction gas. The reactors were vacuumed to 1 Torr by the vacuum pumps 35 and the substrates were previously heated to 300° C. The reaction gas was controlled by the reaction gas flow rate controller such that the $SiH_4$ gas flow rate was 400 cc/min and the $H_2$ gas flow rate was 800 cc/min and the gas pressure was 0.5 Torr. The reaction gas was introduced through the reaction gas supply pipes 38 so that the gas was stably supplied to the deposition chambers. RF power of 100 watts at the frequency of 13.56 MHz was applied to the cathode electrodes from the RF power supply 33 to generate glow discharges between the cathodes and the grounded substrates to form the a-Si:H films on the substrates.

Figure 1:
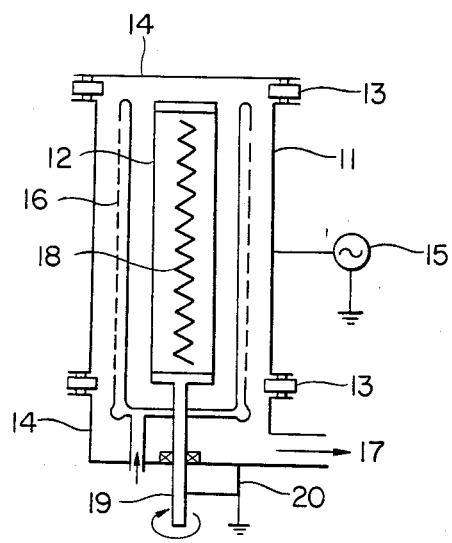
FIG. 1 is a longitudinal sectional view of a reactor of a vapor deposition film forming apparatus.
Figure 2:
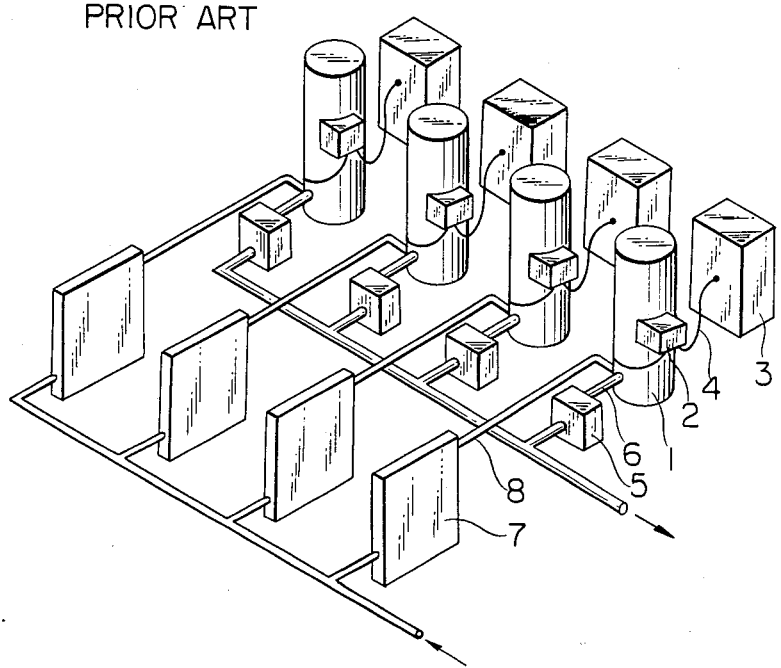
FIG. 2 is a diagram of a prior art apparatus for mass-producing deposition films.

The formed a-Si:H films had an excellent dark resistance characteristic and photo-conductive characteristic and uniform films as those formed by the prior art single-reactor apparatus shown in FIG. 1.

As described hereinabove, in accordance with the present invention, a plurality of reactors are arranged on the circumference of a circle and the exhaust pipes radially extend to the reactors from the center of the circle with the exhaust pipes having the substantially equal exhaust resistance. Thus, the plurality of reactors can be simultaneously vacuumed to the substantially same degree of vacuum by the single set of vacuum pump. Since the substantially equal degree of vacuum can be attained for the reactors arranged on the common circumference of the circle, the increase of the number of vacuum pumps due to the increase of the number of reactors is suppressed. Further, a large quantity of amorphous silicon electrophotographic photoconductor can be stably produced without sacrificing the performance of the conventionally used reactor.

What we claim is:

1. A vapor deposition film forming apparatus having a plurality of reactors each having a substrate and an electrode oppositely arranged in a vacuum chamber and means for applying a voltage thereacross to react or decompose reaction gas introduced into said vacuum chamber, wherein center axes of said reactors are arranged on the circumference of a circle and exhaust pipes having substantially equal exhaust resistance radially extend to said reactors from a common exhaust pipe located at the center of said circle.

* * * * *